United States Patent Office 3,219,447

Patented Nov. 23, 1965

3,219,447

MATERIAL FOR THE PHOTO MECHANICAL MANUFACTURE OF PRINTING PLATES AND METHOD FOR CONVERTING THE SAME INTO PRINTING PLATES

Wilhelm Neugebauer, Georg Werner, and August Rebenstock, Wiesbaden-Biebrich, Germany, assignors, by mesne assignments, to Azoplate Corporation, Murray Hill, N.J.

No Drawing. Filed Jan. 23, 1962, Ser. No. 168,247
Claims priority, application Germany, Jan. 25, 1961, K 42,716
28 Claims. (Cl. 96—33)

This invention relates to presensitized printing plates and, more particularly, to presensitized printing plates comprising a base material having a layer thereon including at least one diazonium salt of an inorganic acid and/or of a low molecular weight organic sulfonic acid, in admixture with at least an equal amount by weight of a novolak.

It is known to the art to use light sensitive diazo compounds for making printing plates by photomechanical means. Thus, using diazonium salts, especially those of higher molecular weight, many colloids can be converted by exposure to light into an insoluble form, resulting in so-called tanned images. In preparing such plates, a base material is coated with a mixture of a diazonium salt and a colloid and, after drying, is exposed under a master. After exposure, the diazonium salt and the colloid is dissolved away from the carrier or base in those areas not struck by light using a suitable developer, which may be water in many cases. In those areas which were exposed to light, a tanned image remains on the base or carrier which is negative in relationship to the master and this tanned image can be used for the production of copies.

Printing plates can also be made using coatings containing diazonium salts, but including no colloids, especially using diazonium salts of higher molecular weight, for example the condensation product of formaldehyde with diazonium salts of diphenylamine. Plates made in this manner are negative working and of high quality.

Heretofore, diazonium salts have not been usable for the photomechanical production of positive working printing plates. The preparation of positive working printing plates has been suggested using low molecular weight basic diazo compounds without the addition of colloids; however, such presensitized plates have not met with commercial success because of the poor quality of the images and the poor performance of the plates.

The present invention provides a method for the photomechanical production of printing plates in which diazonium salts are employed to produce positive working plates. The presensitized plates of this invention are comprised of a conventional base material or carrier and a light sensitive layer bonded thereon, the layer comprising at least one diazonium salt of an inorganic acid and/or of a low molecular weight sulfonic acid in admixture with at least an equal amount of a novolak. The diazonium salt and the novolak should be mixed as homogeneously as possible and the mixture may contain, in addition, additives for the stabilization of the diazonium salts or for increasing the light sensitivity thereof, in accordance with known techniques.

Unexpectedly, it was found that, upon exposure of the presensitized plate of this invention under a master, no tanning is obtained in the light exposed areas, i.e., the phenol-formaldehyde novolak is not rendered insoluble in those areas struck by light, which would create a negative tanned image upon exposure under a positive original. On the contrary, upon treatment of the light exposed areas of the light sensitive layer or coating with dilute alkaline developers, e.g., alkaline phosphate solutions, the coating or layer is dissolved away in those areas struck by light whereas those areas of the coating which were not exposed remain on the carrier, thereby forming a positive copy or image of the master.

A large number of diazonium salts which possess good shelf life and good light sensitivity and which are usable in the presensitized printing plates of this invention, are known from the use thereof in the diazo copying process. Many of these compounds have one or more substituents such as alkyl groups, alkoxy groups or halides. Groups which tend to exert a hydrophilic action, such as free sulphonic groups, have an adverse effect.

Anions of the diazonium salts of inorganic acids which can be used are those, e.g., of hydrochloric, hydrobromic, sulfuric and phosphoric acids. Double salts may also be used, for example, those of zinc, cadmium or cobalt halides. Such double salts often have a low solubility in organic solvents, especially if the diazonium cation is of relatively high atomic weight. A certain degree of solubility of the diazonium salts used for the manufacture of the presensitized plates according to this invention is, however, necessary since the diazonium salts in admixture with a novolak are applied to the base or carrier as a solution in an organic solvent. The solubility of the diazonium salts in organic solvents can be improved, if necessary, by the incorporation of solubilizing substituents such as alkoxy groups, for example.

When using diazonium salts of lower molecular weight sulfonic acids for the manufacture of presensitized plates of the invention it can be advantageous to use diazonium salts of lower molecular weight aliphatic or aromatic sulfonic acids. All sulfonic groups of the sulfonic acid should be bonded to the diazonium group as salts. Since, because of steric hindrance, it is difficult to bond as salts all sulfonic groups of polysulfonic acids to diazonium groups, diazonium salts of lower molecular weight mono- or disulfonic acids are preferably used in this invention.

Diazonium salts of lower molecular weight organic sulfonic acids are known and can be prepared according to methods known in the art, for example, by reaction of aqueous solutions of diazonium salts of inorganic acids, such as diazonium halides or diazonium sulfates, with aqueous solutions of free organic sulfonic acids or the salts thereof; if necessary, a weakly acid solution must be employed to avoid a coupling reaction. Usually, the diazonium salts of the sulfonic acids precipitate as compounds sparingly soluble in water.

The diazonium salts of lower molecular weight organic sulfonic acids have a good shelf life, which is an important feature of presensitized printing plates. The stability of these diazonium salts is also very good in humid atmospheres.

We understand by "lower molecular weight sulfonic acids" acids having a molecular weight below about 1000, especially below 600.

The following is a list of exemplary diazonium salts which are useful for the manufacture of printing plates according to this invention.

Amino benzene diazonium salts:

Diphenylamine-4-diazonium chloride
Diphenylamine-4-diazonium bromide
Diphenylamine-4-diazonium sulfate
4′-chloro-diphenylamine-4-diazonium sulfate
4′-methoxy-diphenylamine-4-diazonium chloride (zinc chloride double salt)
3-methoxy-diphenylamine-4-diazonium chloride
3-methoxy-diphenylamine-4-diazonium salt of phenanthrene-3-sulfonic acid 3-methoxy-diphenylamine-4-bis-diazonium salt of diphenyl-4,4'-disulfonic acid
3-methoxy-diphenylamine-4-diazonium salt of anthracene-1-sulfonic acid
3-methoxy-diphenylamine-4-diazonium salt of anthracene-2-sulfonic acid
3-methoxy-diphenylamine-4-diazonium salt of 4-cyano-diphenyl-3-sulfonic acid
3-methoxy-diphenylamine-4-diazonium salt of 2-hydroxy-carbazole-7-sulfonic acid
3-methoxy-diphenylamine-4-diazonium salt of 3,4-benzo-carbazole-N-sulfonic acid
3-methoxy-diphenylamine-4-diazonium salt of diphenyl-4-sulphonic acid
3-methoxy-diphenylamine-4-bis-diazonium salt of carbazole-2,7-disulfonic acid
3-methoxy-diphenylamine-4-diazonium salt of naphth-(1',2'-4,5)-oxazolone-6'-sulfonic acid
3-methoxy-diphenylamine-4-diazonium salt of phenyl-pyridine-sulfonic acid
3-methoxy-diphenylamine-4-diazonium salt of 1-(3'-tolyl)-benzo-(2'',1''-6,7)-benztriazole-(1,2,3)-3''-sulfonic acid
4'-chloro-2-methoxy-diphenylamine-4-diazonium chloride
4'-methoxy-2-carboxy-diphenylamine-4-diazonium chloride
4'-methoxy-3-carboxy-diphenylamine-4-diazonium sulfate
2'-ethoxy-3-carboxy-diphenylamine-4-diazonium sulfate
4-ethylamino-3-methylbenzene-diazonium chloride (zinc chloride double salt)
4-diethylamine-benzene-diazonium chloride (zinc chloride double salt)
4-amino-2,5-diethoxy-benzene-diazonium salt of ethane sulfonic acid
4-amino-2,5-diethoxy-benzene-diazonium salt of 2-nitro-1-methyl-benzene-4-sulfonic acid
4-amino-2,5-diethoxy-benzene-diazonium salt of 3,6-dichloro-5-nitro-benzene-1-sulfonic acid
4-amino-2,5-diethoxy-benzene-diazonium salt of 4-nitro-diphenylamine-2-sulfonic acid
4-[N-(2',6'-dichlorobenzyl)-amino]-benzene-diazonium salt of 2-chloro-ethane sulfonic acid
4-[N-(2',6'-dichlorobenzyl)-amino]-benzene-diazonium salt of diphenylamine-sulfonic acid
4-[N-(2',6'-dichlorobenzyl)-amino]-benzene-diazonium saltof phenanthreno-3-sulfonic acid
4-[N-(2',6'-dichlorobenzyl)-amino]-benzene-bis-diazonium salt of diphenyl-4,4'-disulfonic acid
4-[N-(2',6'-dichlorobenzyl)-amino]-benzene-diazonium salt of 2-chloro-4-nitro-1-methyl-benzene-6-sulfonic acid
4-[N-(2',6'-dichlorobenzyl)-amino]-benzene-diazonium salt of 3-nitro-benzene-1-sulfonic acid
4-[N-(2',6'-dichlorobenzyl)-amino]-benzene-diazonium salt of benzaldehyde-2-sulfonic acid
4-[N-(2',6'-dichlorobenzyl)-amino]-benzene-diazonium salt of 4-nitro-diphenylamine-2-sulfonic acid
4-[N-(2',6'-dichlorobenzyl)-amino]-benzene-diazonium salt of 2-nitro-phenylether-4-sulfonic acid
4-[N-(2',6'-dichlorobenzyl)-amino]-benzene-diazonium salt of anthracene-1-sulfonic acid
4-[N-(2',6'-dichlorobenzyl)-amino]-benzene-diazonium salt of anthracene-2-sulfonic acid
4-[N-(2',6'-dichlorobenzyl)-amino]-benzene-diazonium salt of dodecyl-sulfonic acid
4-[N-(2',6'-dichlorobenzyl)-amino]-benzene-bis-diazonium salt of acetone-α,α'-disulphonic acid
4-[N-(2',6'-dichlorobenzyl)-amino]-benzene-diazonium salt of 4-cyano-diphenyl-3-sulfonic acid
4-[N-(2',6'-dichlorobenzyl)-amino]-benzene-diazonium salt of diphenyl-4-sulfonic acid
4-[N-(2',6'-dichlorobenzyl)-amino]-benzene-diazonium salt of 2-hydroxy-carbazole-7-sulfonic acid 4-[N-(2',6'-dichlorobenzyl)-amino]-benzene-diazonium salt of 3,4-benzocarbazole-N-sulfonic acid
4-[N-(2',6'-dichlorobenzyl)-amino]-benzene-bis-diazonium salt of carbazole-2,7-disulfonic acid
4-[N-(2',6'-dichlorobenzyl)-amino]-benzene-diazonium salt of naphth-(1',2'-4,5)-oxazolone-6'-sulfonic acid
4-[N-(2',6'-dichlorobenzyl)-amino]-benzene-diazonium salt of phenyl-pyridine-sulfonic acid
4-[N-(2',6'-dichlorobenzyl)-amino]-benzene-diazonium salt of 1-(3'-tolyl)-benzo-(2'',1''-6,7)-benztriazole-(1,2,3)-3''-sulfonic acid
Diphenylamine-4-diazonium salt of 1-hydroxy-naphthalene-6-sulfonic acid
Diphenylamine-4-diazonium salt of pyrene-3-sulfonic acid
Diphenylamine-4-diazonium salt of naphthalene-3-sulfonic acid
Diphenylamine-4-diazonium salt of 1-chloro-naphthalene-4-sulfonic acid
Diphenylamine-4-diazonium salt of 2-bromo-naphthalene-6-sulfonic acid
Diphenylamine-4-tris-diazonium salt of 1-hydroxy-naphthalene-3,6,8-trisulfonic acid
Diphenylamine-4-bis-diazonium salt of 1-hydroxy-naphthalene-4,8-disulfonic acid
Diphenylamine-4-monodiazonium salt of 2-carboxy-naphthalene-1-sulfonic acid
Diphenylamine-4-diazonium salt of alizarin-3-sulfonic acid
4'-methoxy-diphenylamine-4-diazonium salt of alizarin-3-sulfonic acid
Diphenylamine-4-diazonium salt of 2-nitro-1-methyl-benzene-4-sulfonic acid
Diphenylamine-4-diazonium salt of 1-chloro-2,6-dinitro-benzene-4-sulfonic acid
Diphenylamine-4-diazonium salt of 2-chloro-4-nitro-1-methyl-benzene-6-sulfonic acid
Diphenylamine-4-diazonium salt of 1-cyan-naphthalene-3-sulfonic acid
Diphenylamine-4-diazonium salt of 2,3-dihydroxy-naphthalene-6-sulfonic acid
Diphenylamine-4-diazonium salt of diphenylamine-4-sulfonic acid
Diphenylamine-4-diazonium salt of phenanthreno-3-sulfonic acid
Diphenylamine-4-bis-diazonium salt of diphenyl-4,4'-disulfonic acid
Diphenylamine-4-bis-diazonium salt of 4,4'-dinitro-stilbene-2,2'-disulfonic acid
Diphenylamine-4-diazonium salt of 4-nitro-1-methyl-benzene-2-sulfonic acid
Diphenylamine-4-diazonium salt of anthracene-1-sulfonic acid
Diphenylamine-4-diazonium salt of anthracene-2-sulfonic acid
Diphenylamine-4-bis-diazonium salt of acetone-α,α'-disulfonic acid
Diphenylamine-4-diazonium salt of 4-cyano-diphenyl-3-sulfonic acid
Diphenylamine-4-diazonium salt of diphenyl-4-sulfonic acid
Diphenylamine-4-diazonium salt of 2-hydroxy-carbazole-7-sulfonic acid
Diphenylamine-4-diazonium salt of 3,4-benzocarbazole-N-sulfonic acid
Diphenylamine-4-diazonium salt of dodecyl-sulfonic acid
Diphenylamine-4-bis-diazonium salt of carbazole-2,7-disulfonic acid
Diphenylamine-4-diazonium salt of napth-(1',2'-4,5)-oxazolone-6'-sulfonic acid
Diphenylamine-4-diazonium salt of phenyl-pyridine-sulfonic acid
Diphenylamine-4-diazonium salt of 1-(3'-tolyl)-benzo-(2''',1'''-6,7)-benztriazole-(1,2,3)-3''-sulfonic acid
4-N-morpholino-2,5-diethoxy-benzene-diazonium salt of alizarin-3-sulfonic acid 4-N-morpholino-2,5-dibutoxy-benzene-diazonium salt of alizarin-3-sulfonic acid
4-ethylamino-3-methyl-benzene-diazonium salt of 1-chloro-4-nitro-benzo-2-sulfonic acid
4-[N-(2′,6′-dichlorobenzyl)-amino]-benzene-bis-diazonium salt of 1,4-di-p-toluido-anthraquinone-2,2′-disulfonic acid;

Carbazol diazonium salts:

Carbazol-3-diazonium chloride
N-ethylcarbazol-3-bis-diazonium salt of 1,8-dinitro-naphthalene-3,6-disulfonic acid Arylether-diazonium salts:

2,5-dimethoxy-diphenylether-4-diazonium salt of alizarin-3-sulfonic acid
Diphenylether-4-diazonium chloride
2,4-dimethoxy-benzene-1-diazonium salt of anthraquinone-1-sulfonic acid Arylthioether-diazonium salts:

2,5-dimethoxy-4′-methyl-diphenylsulfide-4-diazonium salt of ethane-sulfonic acid
2,5-dimethoxy-4′-methyl-diphenylsulfide-4-diazonium chloride
2,5-dimethoxy-4′-methyl-diphenylsulfide-4-diazonium salt of 3,6-dichloro-5-nitrobenzene-1-sulfonic acid
2,5-dimethoxy-4′-methyl-diphenylsulfide-4-diazonium salt of 2-naphthol-1-diazo-5-sulfonic acid, and Diazonium salts of diphenyl: 2,5,4′-triethoxy-diphenyl-1-diazonium chloride.

The novolaks used in the light sensitive material of this invention are soluble in alkalis and in solvents and are not hardened by heating. These novolaks are known and the manufacture and properties thereof are described in the literature, for example in German Patent Number 201,261; such novolaks are commercially available.

In preparing the presensitized printing plates of this invention, a suitable base material is coated with a solution containing a diazonium salt and a novolak. The concentration of the novolak in solution may be in the range of about 1 to 10% by weight and the concentration of the diazonium salt may be in the range of about 0.2 to 10% by weight. It is recommended that the novolak be used in a concentration of at least 1% by weight and in a quantity at least equivalent to the amount of diazonium salt employed. The ratio of diazonium salt to novolak can be varied within wide limits, i.e., approximately 1:1 to 1:20 parts by weight. Solutions which contain approximately 1% by weight of diazonium salt and 5% by weight of novolak have been found to be very efficacious. The optimum concentration, which is dependent somewhat upon the method of coating, can be ascertained in each case by simple tests. Additives for facilitating the decomposition of the diazonium compounds or for improving the shelf life of the material, as are known to the art, may also be included; also, dyes for improving the contrast of the image can be included. Suitable solvents for preparing the coating solutions are organic solvents such as alcohols, ketones, esters, ethers, and acid amides; these can be employed either individually or in admixture with each other.

Suitable base materials or carriers for the coatings or layers are those which are conventional in photomechanical reproduction processes, for example, metallic plates or foils of aluminum or zinc, or bases of other types, such as paper.

In preparing the printing plates, the light sensitive layer is exposed to light under a master, and the exposed layer is treated with an alkaline solution, for example, an aqueous solution of an alkaline reacting phosphate such as trisodium phosphate. Water soluble organic solvents can also be added to the developer solutions and this often results in an improvement or acceleration of development of those areas struck by light.

The invention will be further illustrated by reference to the following specific examples:

*Example I*

An aluminum foil, mechanically grained by brushing, is coated upon a plate whirler with a solution containing, in 100 parts by volume of glycol monomethylether, 1 part by weight of 4′-methoxy-diphenylamine-4-diazonium chloride and 5 parts by weight of a phenol-formaldehyde resin novolak, for example, the novolak commercially available under the name Alnovol 429–K. The foil, which is then dried with warm air, is exposed under a positive master for a period of about 1 minute to an 18 amp. arc lamp at a distance of about 30 inches, and is then developed by being wiped over with an aqueous 5% solution of trisodium phosphate containing, in addition, 10% of glycol monomethyl-ether. A positive printing plate is obtained from which a large number of prints can be made in an offset printing press.

Similar good results are obtained if, in the sensitizer solution, instead of 4′-methoxy-diphenylamine-4-diazonium chloride, there is employed 4′-methoxy-diphenylamine-4-diazonium bromide, diphenylamine-4-diazonium chloride or the corresponding bromide, 4′-methyl-diphenylamine - 4 - diazonium chloride, carbazol - 3 - diazonium chloride, diphenylether-4-diazonium chloride, diphenylthio-ether-4-diazonium chloride, 3-methyl-4-ethyl-amino-benzene diazonium borofluoride, 2-ethoxy-4-diethyl-amino-benzene-diazonium borofluoride, 4-dipropylamino-benzene-diazonium-borofluoride, or diphenylamino-4-diazonium bis-salt of 4,4′-stilbene-2,2′-disulfonic acid.

Novolaks made according to the disclosure of German Patent No. 201,261, also may be used for preparing the layer described above and an excellent copying material results.

A sensitizing solution, as described above, can also be employed with excellent results for sensitizing zinc plates or for making paper base printing plates, for example, using paper carriers as described in U.S. Patent No. 2,681,617.

*Example II*

An anodically oxidized aluminum foil is coated with a solution of glycol monomethylether, containing 1% by weight of 4-[N-(2′,6′-dichlorbenzyl)-amino]-benzene-1-diazonium sulfate and 5% by weight of novolak. The dried foil, upon exposure under a master and development with a 5% aqueous trisodium phosphate solution, becomes a positive working plate. Similar good results are obtained using the zinc chloride double salt of diazotized 4-dimethylaminoaniline or 4-diethylaminoaniline or the zinc chloride double salt of diazotized 4-ethyl-amino-3-methyl-aniline or the 2,5,4′-trimethoxy-diphenyl-4-diazonium-hydrogene-sulfate.

*Example III*

Following the procedure of Example I above, the diphenylamine-4-diazonium salt of 1-hydroxy-naphthalene-6-sulphonic acid is used for preparing the sensitizing solution. The copying material obtained and the printing plates resulting therefrom are of high quality.

The diazonium salt is made as follows:

2.5 parts by weight of diphenylamine-4-diazonium hydrogen sulfate are dissolved in 100 parts by volume of water and the solution is purified by the addition of charcoal, followed by filtration (solution No. 1). In an analogous manner an approximately 4% by weight solution of the sodium salt of 1-hydroxy-naphthalene-6-sulphonic acid in water is prepared (solution No. 2). While stirring, sufficient solution No. 2 is slowly added to solution No. 1 to precipitate all of the diphenylamine-4-diazonium salt of the 1-hydroxy-naphthalene-6-sulphonic acid, which precipitates in the form of brown-yellow flakes. The precipitate is filtered off and freed from the mother liquor by washing with water, after which the purified salt is dried at a slightly elevated temperature.

*Example IV*

Following the procedure of Example I, with the exception that the 2,5-diethoxy-4-N-morpholino-benzene-diazonium salt of alizarin-3-sulfonic acid was used for preparing the light sensitive layer, a printing plate was obtained which was capable of high performance.

The diazonium salt of alizarin-3-sulfonic acid is prepared as follows:

15 parts by weight of 2,5-diethoxy-4-morpholino-benzene-diazonium chloride-zinc chloride double salt are dissolved in 400 parts by volume of water and filtered, after the addition of charcoal. While stirring, 1.5 liters of a 1% aqueous solution of the sodium salt of alizarin-3-sulfonic acid are slowly added, whereupon the 2,5-diethoxy-4-morpholino-benzene-diazonium salt of the alizarin sulfonic acid precipitates. The condensation product is filtered off, washed with water, and dried.

*Example V*

Following the procedure of Example I, with the exception that the bis-diphenylamine-4-diazonium salt of 2-hydroxy-naphthalene-3,7-disulfonic acid is used for preparing the sensitizing solution, a printing plate is obtained capable of long runs.

The diazonium salt is prepared as follows:

200 parts by volume of a 2.5% by weight aqueous solution of diphenylamine-4-diazonium hydrogen sulfate are filtered, after the addition of charcoal. While stirring, 50 parts by volume of a filtered aqueous 10% by weight solution of the sodium salt of 2-hydroxy-naphthalene-3,7-disulphonic acid are slowly added to the filtrate. The reaction product precipitates as fine orange colored crystals and is then filtered, washed with distilled water, and dried. In an analogous manner, other diazonium salts, such as chlorides, sulfates or zinc chloride double salts, can be transformed into various salts of lower molecular weight organic sulphonic acids which are useful in preparing the light sensitive layers of this invention.

The following method has proved advantageous: The sulphonic acids or their salts are dissolved in water, and for each equivalent of sulfo group and equivalent (by weight) of the diazo compound, dissolved in water, is added. If a preliminary test shows that the compounds tend to couple with each other, the solution should be rendered weakly acid.

*Example VI*

The procedure of Example I above is followed. However, for making the sensitizing solution applied to the aluminum foil, a solution is used which contains in:

100 parts of a mixture of equal parts by volume of glycolmonomethylether and dimethylformamide, 1 part by weight of 4-[N-(2′,6′-dichlorobenzyl)-amino]-benzene diazonium salt of 1-hydroxy-4-p-toluido-anthraquinone-2- sulfonic acid and 5 parts by weight of novolak, or in:

100 parts by volume of dimethylformamide, 0.5 part by weight of 4-[N-(2′,6′-dichlorbenzyl)-amino]-benzene-diazonium salt of 2-chlorethanesulfonic acid and 2 parts by weight of novolak, or in:

100 parts by volume of a mixture of glycolmonomethylether and dimethylformamide in a ratio of 4:1, 1 part by weight of 4-amino-2,5-diethoxy-benzene-diazonium salt of ethanesulfonic acid and 4 parts by weight of novolak, or in:

100 parts by weight of a mixture of glycolmonomethylether and dimethylformamide in a ratio of 1:1, 1 part by weight of 4-[N-(2′,6′-dichlorbenzyl)-amino]-benzene-diazonium salt of 1,4-di-p-toluido-anthraquinone-2′, 2″-disulfonic acid and 5 parts by weight of novolak, or in:

100 parts by volume of glycolmonomethylether, 1 part by weight of 2,5-dimethoxy-4′-diphenylsulfide-4-diazonium salt of ethane-sulfonic acid, 5 parts by weight of novolak.

The foregoing diazonium salts may be prepared according to known methods, for example, by the double conversion of the respective amines diazotized in hydrochloric acid with alkali salts of the respective sulfonic acid.

*Example VII*

A zinc plate, precleaned, for example, with trichlorethylene, is coated with a solution which contains, in 100 parts by volume of a mixture of glycolmonomethylether and dimethylformamide in a ratio of 3:2, 1 part by weight of the chloride of the condensation product of 1 mole of diazotized 4-amino-diphenylamine and 1 mole of formaldehyde in admixture with 5 parts by weight of novolak. The coated zinc plate is dried with warm air, exposed under a positive original or master and the exposed plate is developed with the alkaline developer employed in Example I above.

Positive printing plates thus obtained are highly efficacious when used as offset plates. By etching with nitric acid in known manner, a positive relief printing plate is obtained from the developed plate.

The chloride of the condensation product of formaldehyde and diazotized 4-amino-diphenylamine is obtained by stirring diphenylamine-4-diazonium chloride and formaldehyde in molar quantities by weight in concentrated hydrochloric acid, for example, 46 parts by weight of diphenylamine-4-diazonium chloride and 6 parts by weight of paraformaldehyde are stirred in 200 parts by volume of concentrated hydrochloric acid for a period of 8 hours at a temperature of 50° C., followed by stirring for 12 hours at room temperature. The reaction mixture is evaporated to complete dryness under vacuum at a temperature of 50 to 55° C.

It will be obvious to those skilled in the art that many modifications may be made within the scope of the present invention without departing from the spirit thereof, and the invention includes all such modifications.

What is claimed is:

1. A presensitized printing plate comprising a base material having a layer thereon comprising at least one organic solvent-soluble diazonium salt of a compound selected from the group consisting of an inorganic acid and a low molecular weight organic sulfonic acid, in admixture with at least an equal amount by weight of an alkali-soluble novolak.

2. A presensitized printing plate according to claim 1 in which the base material is aluminum.

3. A presensitized printing plate according to claim 1 in which the salt is diphenylamine-4-diazonium chloride.

4. A presensitized printing plate according to claim 1 in which the salt is diphenylamine-4-diazonium bromide.

5. A presensitized printing plate according to claim 1 in which the salt is the zinc chloride double salt of diazotized 4-ethylamino-3-methylaniline.

6. A presensitized printing plate according to claim 1 in which the salt is the diphenylamine-4-diazonium salt of 1-hydroxy-naphthalene-6-sulfonic acid.

7. A presensitized printing plate according to claim 1 in which the salt is the 2,5-diethoxy-4-morpholino-benzene-diazonium salt of alizarin-3-sulfonic acid.

8. A presensitized printing plate according to claim 1 in which the salt is the bis-diphenylamine-4-diazonium salt of 2-hydroxynaphthalene-3,7-disulfonic acid.

9. A presensitized printing plate according to claim 1 in which the salt is the 2,5-dimethoxy-4′-methyldiphenylsulfide-4-diazonium salt of ethanesulfonic acid.

10. A presensitized printing plate according to claim 1 in which the salt is the chloride of a condensation product of diazotized 4-amino-diphenylamine and formaldehyde.

11. A presensitized printing plate according to claim 1 in which the salt is an aminobenzenediazonium salt.

12. A presensitized printing plate according to claim 1 in which the salt is a diphenylamine-4-diazonium salt.

13. A presensitized printing plate according to claim 1 in which the salt is a carbazol diazonium salt.

14. A presensitized printing plate according to claim 1 in which the salt is a diphenyl diazonium salt.

15. A process for developing a printing plate which comprises exposing a supported layer to light under a master and treating the exposed layer with a weakly alkaline developer, the layer comprising at least one organic solvent-soluble diazonium salt of a compound selected from the group consisting of an inorganic acid and a low molecular weight organic sulfonic acid, in admixture with at least an equal amuont by weight of an alkali-soluble novolak.

16. A process according to claim 15 in which the support is aluminum.

17. A process according to claim 15 in which the salt is diphenylamine-4-diazonium chloride.

18. A process according to claim 15 in which the salt is diphenylamine-4-diazonium bromide.

19. A process according to claim 15 in which the salt is the zinc chloride double salt of diazotized 4-ethylamino-3-methylaniline.

20. A process according to claim 15 in which the salt is the diphenylamine-4-diazonium salt of 1-hydroxy-naphthalene-6-sulfonic acid.

21. A process according to claim 15 in which the salt is the 2,5-diethoxy-4-N-morpholino-benzene-diazonium salt of alizarin-3-sulfonic acid.

22. A process according to claim 15 in which the salt is the bis-diphenylamine-4-diazonium salt of 2-hydroxy-naphthalene-3,7-disulfonic acid.

23. A process according to claim 15 in which the salt is the 2,5-dimethoxy-4′-methyl-diphenylsulfide-4-diazonium salt of ethanesulfonic acid.

24. A process according to claim 15 in which the salt is the chloride of a condensation product of diazotized 4-aminodiphenylamine and formaldehyde.

25. A process according to claim 15 in which the salt is an aminobenzenediazonium salt.

26. A process according to claim 15 in which the salt is a diphenylamine-4-diazonium salt.

27. A process according to claim 15 in which the salt is a carbazol diazonium salt.

28. A process according to claim 15 in which the salt is a diphenyl diazonium salt.

References Cited by the Examiner

UNITED STATES PATENTS

| | | | |
|---|---|---|---|
| 3,010,389 | 11/1961 | Buskes | 96—33 X |
| 3,061,429 | 10/1962 | Neugebauer et al. | 96—33 |
| 3,061,430 | 10/1962 | Uhlig et al. | 96—33 |

OTHER REFERENCES

Hackh's Chemical Dictionary, The Blakiston Co., Philadelphia, 1944, pp. 584 and 734.

NORMAN G. TORCHIN, *Primary Examiner.*

PHILIP E. MANGAN, *Examiner.*